(12) United States Patent
Tews et al.

(10) Patent No.: US 6,335,247 B1
(45) Date of Patent: Jan. 1, 2002

(54) INTEGRATED CIRCUIT VERTICAL TRENCH DEVICE AND METHOD OF FORMING THEREOF

(75) Inventors: Helmut Horst Tews, Poughkeepsie, NY (US); Alexander Michaelis, Dormagen (DE); Stephan Kudelka; Uwe Schroeder, both of Fishkill, NY (US); Brian S. Lee, New York, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/597,389

(22) Filed: Jun. 19, 2000

(51) Int. Cl.[7] .............................................. H01L 21/336
(52) U.S. Cl. ........................ 438/270; 438/268; 438/733
(58) Field of Search ................................ 438/268, 705, 438/733, 735, 270

(56) References Cited

U.S. PATENT DOCUMENTS

| | | | | |
|---|---|---|---|---|
| 4,907,063 A | * | 3/1990 | Okada et al. ................. | 357/54 |
| 5,078,833 A | * | 1/1992 | Kadomura .................... | 156/643 |
| 5,364,810 A | * | 11/1994 | Kosa et al. .................... | 437/52 |
| 5,930,585 A | * | 7/1999 | Coronel et al. ................ | 438/5 |
| 6,121,102 A | * | 9/2000 | Norstrom et al. ............ | 438/361 |

\* cited by examiner

Primary Examiner—Richard Elms
Assistant Examiner—Bradley Smith
(74) Attorney, Agent, or Firm—Stanton Braden

(57) ABSTRACT

A method of forming a vertically-oriented device in an integrated circuit using a selective wet etch to remove only a part of the sidewalls in a deep trench, and the device formed therefrom. While a portion of the trench perimeter (e.g., isolation collar 304) is protected by a mask (e.g., polysilicon 318), the exposed portion is selectively wet etched to remove selected crystal planes from the exposed portion of the trench, leaving a flat substrate sidewall (324) with a single crystal plane. A single side vertical trench transistor may be formed on the flat sidewall. A vertical gate oxide (e.g. silicon dioxide 330) of the transistor formed on the single crystal plane is substantially uniform across the transistor channel, providing reduced chance of leakage and consistent threshold voltages from device to device. In addition, trench widening is substantially reduced, increasing the device to device isolation distance in a single sided buried strap junction device layout.

19 Claims, 4 Drawing Sheets

INTEGRATED CIRCUIT VERTICAL TRENCH DEVICE AND METHOD OF FORMING THEREOF

TECHNICAL FIELD

The present invention relates generally to an integrated circuit ("IC") and method of forming thereof, and more particularly to an integrated circuit vertical trench device and method of forming thereof.

BACKGROUND

The semiconductor industry is continuously trying to decrease the size of the semiconductor devices located on integrated circuits. Miniaturization is generally needed to accommodate the increasing density of circuits necessary for today's semiconductor products. For example, it is not uncommon for there to be millions of semiconductor devices on a single semiconductor product.

Typically, the focus of miniaturization has been placed on the two-dimensional horizontal plane of a semiconductor device, and devices have approached sizes down to tenths of microns and less. There is some limit, however, as to how far a horizontally oriented semiconductor device can be shrunk, and as devices are made even smaller, it is generally becoming increasingly difficult to further miniaturize a device's horizontal dimensions. In addition, the decreasing horizontal dimensions of semiconductor devices generally tend to create problems in the operational characteristics of the semiconductor devices.

One such semiconductor product widely used in electronic systems for storing data is a semiconductor memory, and one common type of semiconductor memory is a dynamic random access memory ("DRAM"). A DRAM may include millions or billions of individual DRAM cells, each cell storing one bit of data. A DRAM memory cell typically includes an access field-effect transistor ("FET") and a storage capacitor. The access FET allows the transfer of data charges to and from the storage capacitor during reading and writing operations. In addition, the data charges on the storage capacitor are periodically refreshed during a refresh operation.

Semiconductor memory density is typically limited by a minimum lithographic feature size that is imposed by lithographic processes used during fabrication. There is a continuing need in the art to provide even higher density memories in order to further increase data storage capacity and reduce manufacturing costs.

One way of increasing the data storage capacity of semiconductor memories is to reduce the amount of integrated circuit horizontal planar area consumed by each memory cell. For horizontally oriented devices, this may be done by decreasing the size of the access FET or the storage capacitor, or both. This approach has limits, however, due to minimum producible structure size in a given fabrication technology, and the problems associated with devices with small dimensions, such as hot carriers, punch through, and excess leakage.

Another way of providing planar area reduction is the use of a three-dimensional arrangement of the access FET and the storage capacitor. One such arrangement is a planar FET next to a deep trench capacitor. A trench typically has a depth of 5–8 um and an oval top-down-view shape. The trench capacitor has plates which are located vertically along the walls of the trench instead of being parallel to the surface of the integrated circuit substrate. This permits a large capacitance per planar unit area of substrate, while at the same time allowing the device to be of a manageable size for purposes of operation.

To still further reduce the amount of planar area required for each cell, it has been proposed to use a vertical trench transistor in conjunction with a vertical trench capacitor in a memory cell. In a typical design, the vertical capacitor is generally fabricated in a trench, with one conductive plate being formed in the substrate, the dielectric being formed on the trench sidewalls, and the other conductive plate being formed in the interior of the trench. A vertical trench transistor is generally fabricated adjacent to an upper portion of the trench, with the source and drain being fabricated in the substrate, and the vertically-oriented gate being fabricated in the trench.

There are generally several problems, however, with prior art approaches to fabricating a vertical transistor in a DRAM cell. One difficult fabrication issue is related to formation of the vertically-oriented gate. Typically, the gate insulator is an oxide produced by thermal oxidation of the trench sidewall. The thickness of the gate insulator generally determines the threshold voltage required to turn on the device. Ideally, the gate insulator thickness should be uniform along the channel length and width.

The oxidation rate of the trench sidewall, however, is generally highly dependent upon the crystal plane orientation of the sidewall. In other words, different crystal planes may generate oxides of very different thicknesses when subjected to the same thermal oxidation process. In a trench formed in a substrate (e.g., a rounded (including oval) trench, top-down view), different crystal orientations are exposed to the oxidation process because the sidewalls cut through different crystal planes in the substrate. Thermal oxidation of the sidewalls thus results in different oxide thicknesses around the trench dependent upon crystal orientation. A non-uniform oxide thickness for the gate insulator may cause leakage. And other device reliability problems. In addition, the non-uniformity may cause inconsistent threshold voltages from device to device.

One proposal to alleviate this problem is to use a selective wet etch which etches, for example, the <100> crystal planes faster than the <110> crystal planes. This generally results in a rectangular trench shape with substantially only <110> planes, although small <100> planes may remain in the partially rounded corners. Thermal oxidation should then result in substantially uniform oxide thickness, except perhaps at the corners of the trench. While this process is more robust than previous processes, a potential problem with this approach is that the <110> planes are partially etched along with the <100> planes, albeit at a much slower rate. This may lead to a widening of the trench in the <110> plane direction, which may decrease the effective distance from the components (e.g., buried strap connection) of one trench to the components (e.g., isolation collar) of an adjacent trench.

SUMMARY OF THE INVENTION

These problems are generally solved or circumvented, and technical advantages are generally achieved, by a preferred embodiment of the invention in which a selective wet etch is used to etch only a part of the trench sidewalls. While a portion of the trench perimeter is protected by a mask, the exposed portion is selectively wet etched to remove selected crystal planes from the exposed portion of the trench. Then, a single side vertical device process may be used to form, for example, a single side vertical trench transistor on a flat sidewall having a single crystal plane. Because a portion of the trench is masked, the trench does not widen in that direction during the selective wet etch, and device to device isolation is improved over that achieved with previous methods.

In accordance with a preferred embodiment of the present invention, a DRAM IC comprises a deep trench located in a semiconductor substrate, the trench having an upper portion with a perimeter comprising a rounded side and a flat side opposite the rounded side. The flat side of the perimeter of the trench comprises a flat substrate sidewall with a substantially single crystal plane, and a vertically-oriented device is located on the flat substrate sidewall. The vertically oriented device is preferably a transistor with a vertical gate oxide formed on the flat substrate sidewall.

In accordance with another preferred embodiment of the present invention, a method of forming a vertically oriented device in a deep trench on a semiconductor substrate, the trench comprising a rounded perimeter, comprises masking a first region of a substrate sidewall in the trench, wherein a second region of the substrate sidewall in the trench is exposed, the second region comprising multiple substrate crystal planes, selectively etching a first crystal plane of the multiple substrate crystal planes in the trench, thereby forming a substantially flat substrate sidewall comprising a second crystal plane in the second region of the trench, wherein the perimeter in the first region of the trench remains rounded, and forming a vertical component of the vertically oriented device on the flat substrate sidewall. The vertically oriented device is preferably a transistor with a vertical gate oxide, and the semiconductor substrate is preferably used in a DRAM integrated circuit.

An advantage of a preferred embodiment of the present invention is that a DRAM memory cell may be formed with a trench capacitor and a vertical transistor, thus using devices of manageable size yet occupying minimal horizontal planar area.

Another advantage of a preferred embodiment of the present invention is that the vertical gate oxide is substantially uniform across the channel width and length, providing reduced chance of leakage, and consistent threshold voltages from device to device.

Another advantage of a preferred embodiment of the present invention is that trench widening is substantially reduced, increasing the device to device (e.g., buried strap to collar oxide) isolation distance in a single sided buried strap junction device layout.

Another advantage of a preferred embodiment of the present invention is that the vertical transistor may be formed with a more robust process than those used in the prior art.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention. The figures are drawn so as to clearly illustrate the relevant aspects of the preferred embodiments, and are not necessarily drawn to scale.

The invention relates to integrated circuits, including memory ICs such as random access memories ("RAM"s), DRAMs, synchronous DRAMS ("SDRAM"s), merged DRAM-logic circuits ("embedded DRAM"s), or other circuits. The invention also relates to semiconductor processes and structures, including vertical capacitors, vertical transistors, trench capacitors and trench transistors, the connections between such semiconductor devices, or other processes and structures.

Figure 1:
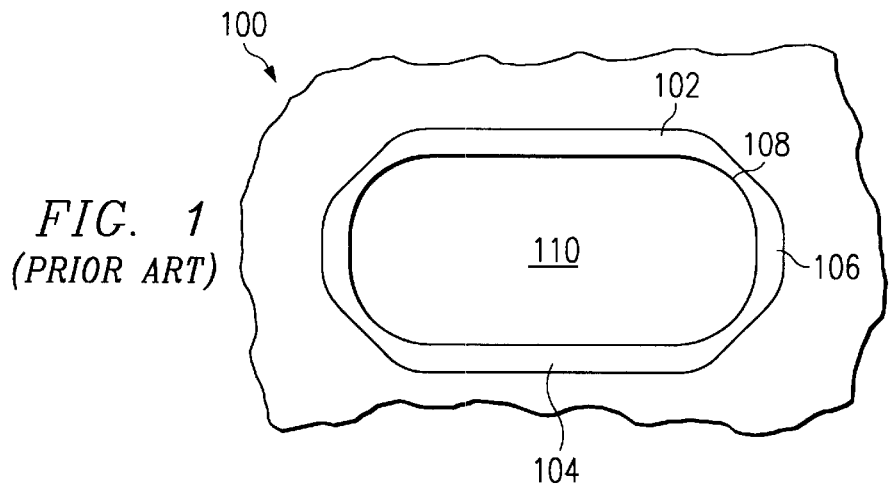
FIG 1 is a plan view of a prior art round deep trench with oxidized sidewalls.

Referring now to FIG. 1, there is illustrated a top-down view of a prior art oval DRAM storage trench 100 located in a silicon semiconductor substrate. The sidewalls of trench 100 have been thermally oxidized to form gate oxide 102 on the sidewalls. Trench 100 has also been filled with polysilicon layer 110. The thickness of gate oxide 102 is highly dependent upon the crystal plane orientation of the substrate sidewalls.

The crystal plane in the corners of the oval is the <100> crystal plane, while the crystal plane along the sides of the oval is the <110> crystal plane. Because the thermal oxidation process is selective to crystal planes, the oxide is much thicker along the sides then in the corners of the oval perimeter. For example, the oxide thickness may be about 55–70 angstroms thick in corners 108, while the oxide thickness may be about 115–140 angstroms thick along sides 104 and 106. This variation in the thickness of gate oxide 102 may cause device reliability problems and inconsistent threshold voltages.

Figure 2:
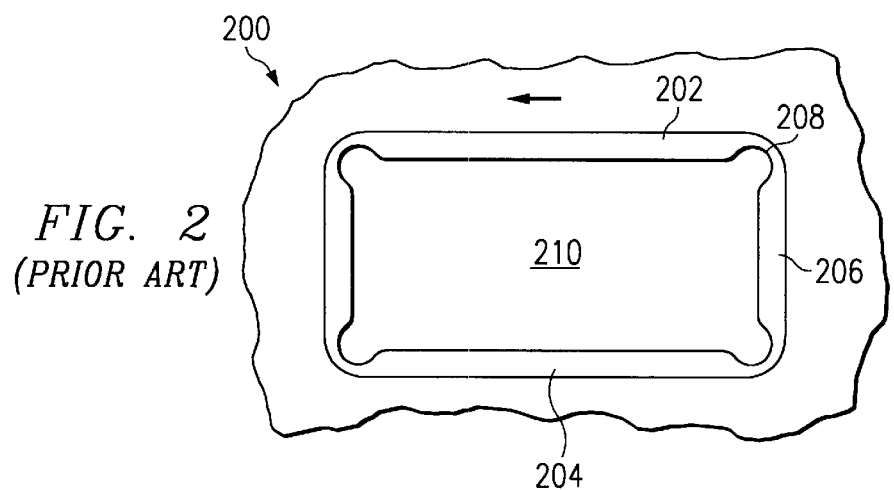
FIG. 2 is a plan view of a prior art rectangular deep trench with oxidized sidewalls.

With reference to FIG. 2, one approach to reducing these problems is to use a selective wet etch to effectively reduce or remove the <100> crystal planes from the trench sidewalls. A $NH_4OH$ solution, for example, is highly selective to etching the silicon <100> crystal planes over the <110> crystal planes. As shown in FIG. 2, the selective wet etch has the effect of changing the shape of trench 200 from oval to rectangular, albeit with rounded corners. After the etch, the substrate sidewalls comprised primarily <110> crystal plane faces, although a small region of <100> crystal planes may remain in the corners of the trench. The substrate sidewalls may then be thermally oxidized to form oxide 202. The thickness of oxide 202 is much more consistent than that of the oxide shown in FIG. 1. Along flat sidewalls 204 and 206, the oxide has a substantially uniform thickness. The only regions with varying thickness are the corners 208 of the rectangular trench, which may be due to the remaining <100> crystal planes. The selective wet etch, however, is not perfectly selective to the <100> crystal planes, and the <110> crystal planes are also partially etched. This may cause problems in devices with small geometries because the devices are so close together, and an increase in trench size reduces the isolation distance between adjacent trench devices.

Figure 3A:
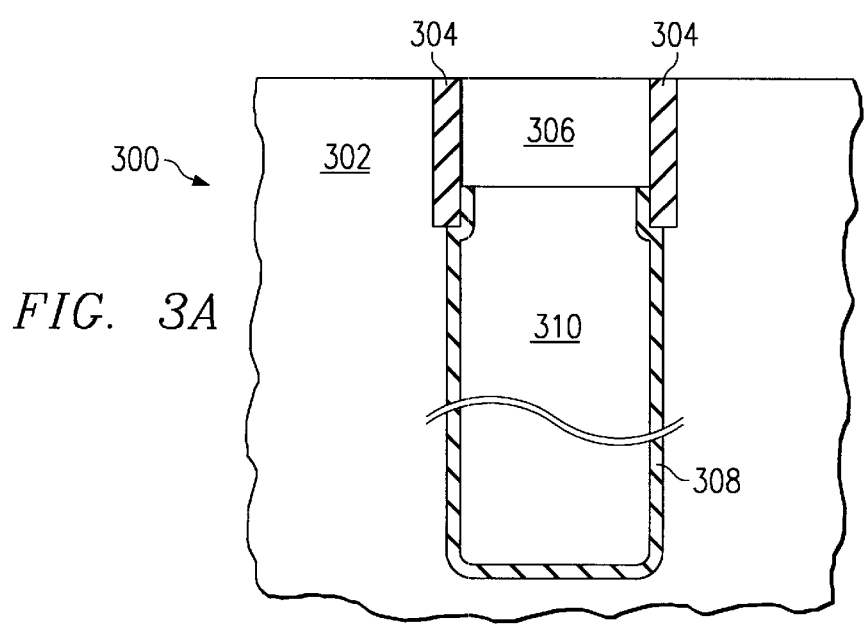
FIGS. 3A, 4A, 5A and 6A are cross-sectional views of an integrated circuit structure in accordance with a preferred embodiment of the present invention at various stages of fabrication.
Figure 3B:
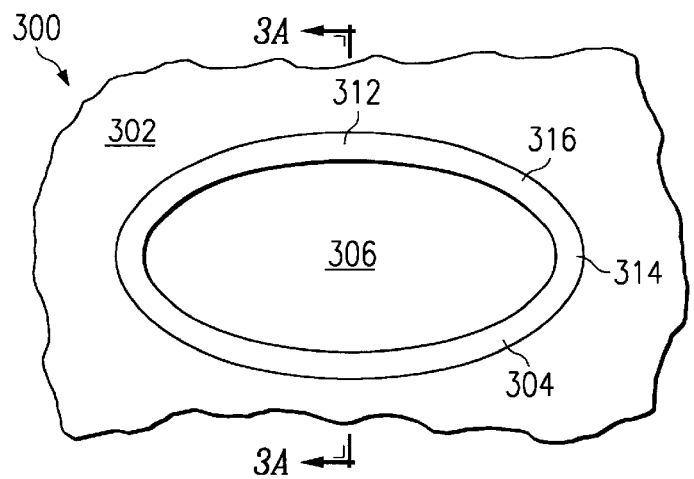
FIGS. 3B, 4B, 5B and 6B are plan views of the integrated circuit structure illustrated in FIGS. 3A, 4A, 5A and 6A, respectively.

With reference now to FIGS. 3A and 3B, there are illustrated a cross-sectional view and a top-down view, respectively, of a vertical semiconductor device 300 formed in substrate 302, at one stage of processing. Substrate 302 preferably comprises silicon, although it may comprise other semiconductor materials, such as gallium arsenide. Substrate 302 is consistently assumed to be a p-substrate for ease of discussion, although an n-substrate may also be employed to form trench capacitors, as is well known to those skilled in the art. To form the trench, a pad nitride and a hard mask layer (not shown) are formed on the surface of substrate 302 and patterned to form a mask for the etching of the deep trench. Pad nitride layer may be a layer of $N_xO_y$ and may be, for example, 150 to 250 nm thick, although other suitable mask materials may be used. The trench is formed in substrate 302 using a suitable etching process, such as dry etching, of which reactive ion etching ("RIE") is one example. Preferably, the deep trench is between 5 and 8 microns deep, and may be as small as 150 nm across or smaller, although other dimensions may be used depending on the particular application.

Within the trench, isolation collar 304 is formed on the upper portion of the trench sidewalls, down to about 1.5 microns into the trench, and is generally for the purposes of providing isolation and preventing the formation of parasitic elements. Isolation collar 304 is preferably an oxide (e.g., silicon dioxide), although any other suitable insulative material such as silicon nitride may be used. Isolation collar 304 may be formed by a Local Oxidation of Silicon ("LOCOS") process, by a tetraethyloxysilane decomposition process ("TEOS process"), or by any other suitable oxide formation process.

A buried plate, which will function as the first plate of the trench capacitor, is formed in the trench walls underneath collar oxide 304. Methods of deposition include, for example, chemical vapor deposition, plasma vapor deposition, sputtering or any other suitable deposition technique. Node dielectric 308 is then formed on the trench sidewalls and the exposed walls of collar oxide 304. Node dielectric 308 will function as the capacitor dielectric, and is preferably silicon dioxide, but may be formed of other low or high dielectric constant materials, such as silicon nitride.

The trench is filled with a material, such as heavily doped polysilicon 310, that will form the inner plate of the trench capacitor. Preferably, polysilicon 310 is deposited over the entire substrate, also filling the trench, and then is planarized/recessed down to approximately the level of the pad nitride using chemical mechanical polishing ("CMP"). Planarization and/or recessing may be also accomplished by, for example, polishing, etching, recessed etching or any other suitable recessing technique. Polysilicon 310 and node dielectric 308 are then recessed down into the trench, exposing a portion of isolation collar 304. Finally, a mask material, such as polysilicon 306, is used to fill in the trench. Alternatively, a trench bottom process may be used to increase the surface area of node dielectric 308 inside the trench, and thus the capacitance of the trench capacitor.

In the top-down view of FIG. 3B, silicon substrate 302 has a <110> crystal plane near side 312 and near end 314, and a <100> crystal plane near corner regions 316.

Figure 4A:
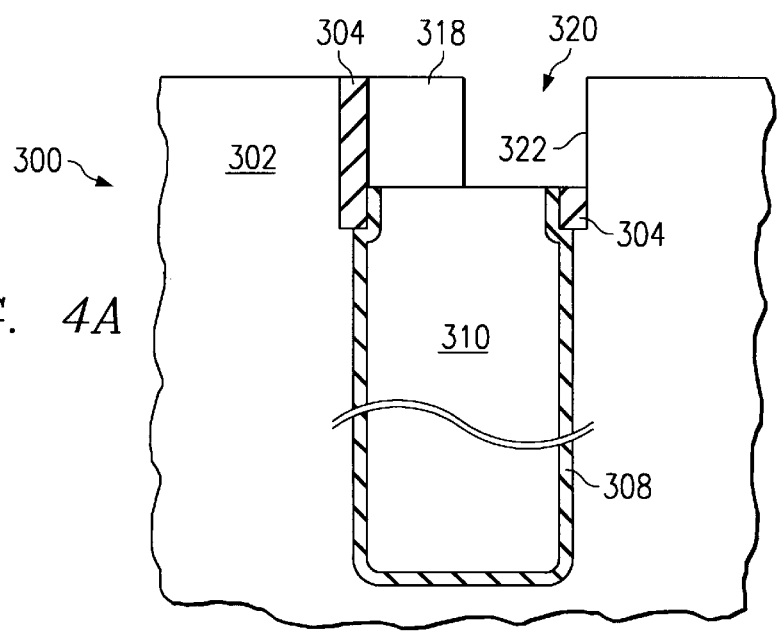
Figure 4B:
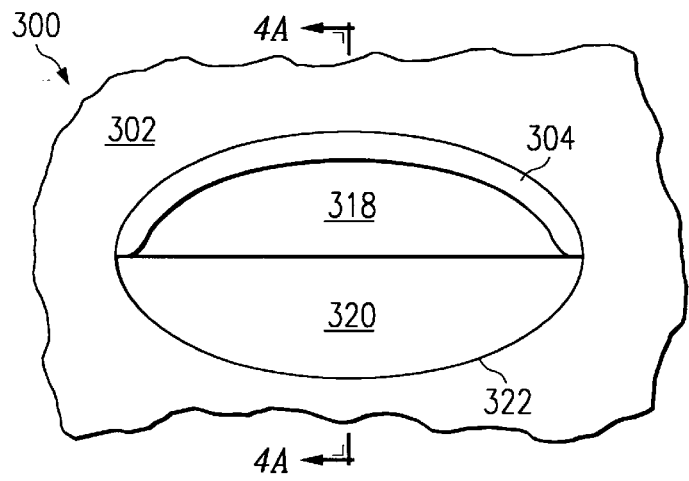

With reference now to FIGS. 4A and 4B, there are shown cross-sectional view and a top-down view, respectively, of device 300 after subsequent processing. Polysilicon mask layer 306 is removed from a portion of the trench, exposing isolation collar 304 in that region. An oxide etch is then used to remove that portion of isolation collar 304. The upper surface of remaining isolation collar 304 is protected from the etch by a mask, such as a pad nitride. This process creates etched region 320 in which isolation collar 304 has been removed, exposing substrate sidewall 322 adjacent etched region 320, while polysilicon mask layer 318 and isolation collar 304 still protected the remaining substrate sidewall.

Figure 5A:
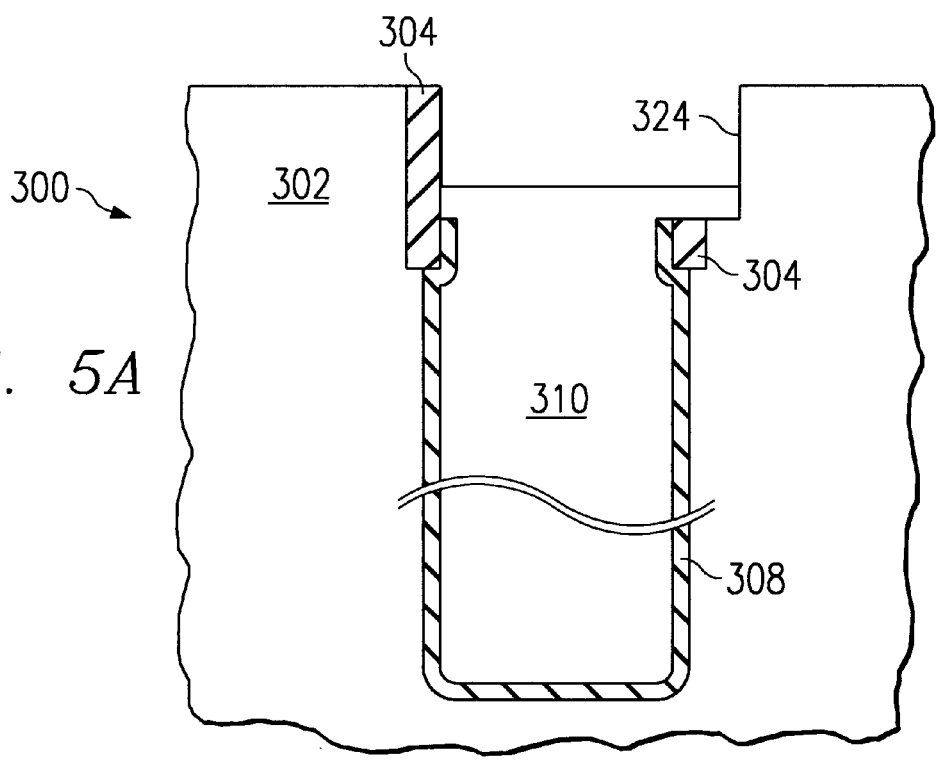
Figure 5B:
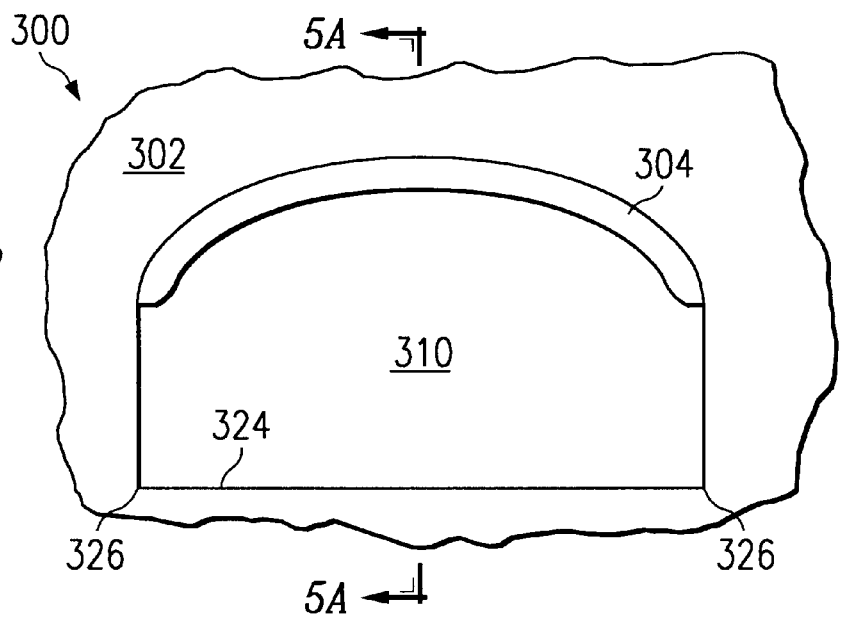

Referring to FIGS. 5A and 5B, there are illustrated cross-sectional and top-down views, respectively, of structure 300 after further processing in accordance with a preferred embodiment of the present invention. A diluted 200:1 HF solution may be used to condition the substrate by removing any chemical oxide from the exposed silicon surfaces. Then a crystal plane dependent selective wet etch is used to preferentially remove the silicon from the <100> crystal planes. The selective etch chemistry may be based on, for example, an $NH_4OH$ solution. Selectivity between the <100> crystal plane and the <110> crystal plane is preferably 2:1 or greater. The etch selectivity results in a strong removal of silicon in the <100> directions, but much less in the <110> direction. The result is a trench shape that is rounded (e.g., oval) on one side and rectangular on the opposite side. The side with the isolation collar 304 remains rounded, while the etched side is made rectangular. Flat substrate sidewall 324 comprises primarily a <110> crystal plane, although corners 326 may comprise some exposed <100> crystal planes.

In the preferred embodiment, only one side of the trench is etched, and the etching is self-aligned to the remaining isolation collar. Because one side of the trench is masked, trench widening in the <110> direction is reduced by about one half compared with previous methods. This helps keep sufficient isolation distance between adjacent deep trenches and their associated devices, such as the buried strap of one deep trench device and the isolation collar of an adjacent deep trench device.

Figure 6A:
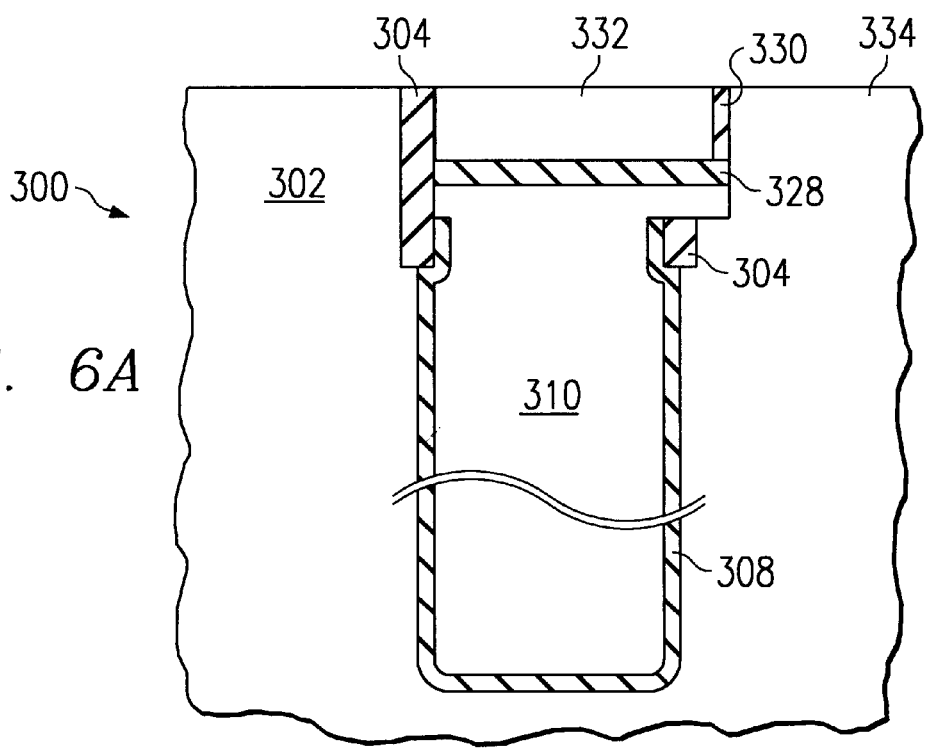
Figure 6B:
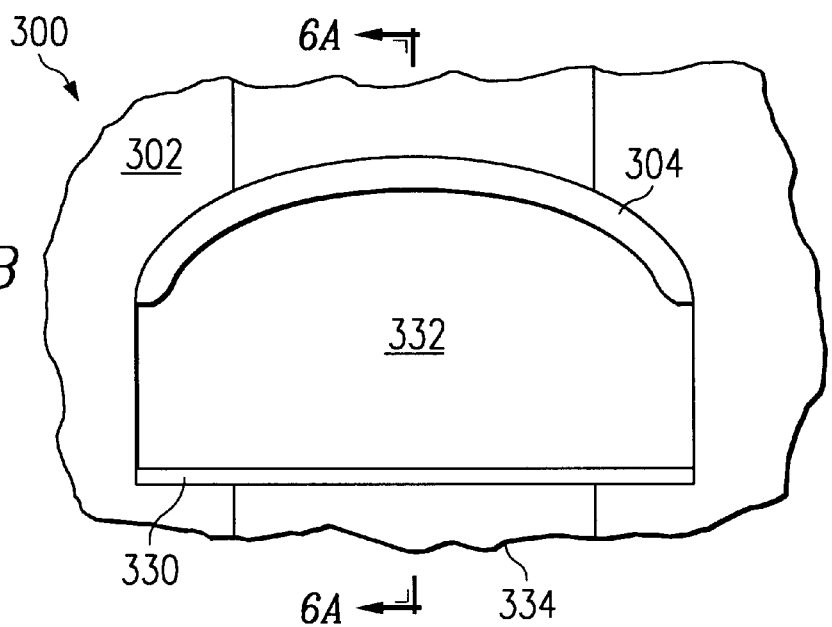

Referring to FIGS. 6A and 6B, there are illustrated cross-sectional and top-down views, respectively, of structure 300 after further processing in accordance with a preferred embodiment of the present invention. After formation of flat substrate sidewall 324, a trench top oxide 328 is formed overlying capacitor inner plate 310 to provide isolation between the trench capacitor and overlying structures. Trench top oxide 328 is preferably silicon dioxide, but may be silicon nitride or any other suitable insulator material. Vertical transistor active area 334 may be formed in the silicon substrate 300 adjacent to flat substrate sidewall 324. The drain of the transistor is formed in the lower portion of active area 334m connected via a buried strap to inner plate 310 of the trench capacitor.

Gate insulator 330 is then formed vertically on the flat trench sidewall alongside active area 334. Gate insulation layer 138 is formed on only one side of the trench, and is formed only on the flat substrate sidewall 324, which comprises the single <110> crystal plane. Gate insulation layer 330 may be formed, for example, by a dry oxidation or thermal oxidation technique or any other suitable deposition technique. Gate insulation layer 330 is preferably silicon dioxide, but may also be silicon nitride or any other suitable insulative material. Because the gate oxide is formed on a single crystal plane, the gate oxide layer has a substantially uniform thickness across the active area of the transistor channel.

A gate electrode material, e.g., polysilicon is then used to fill in the top part of the trench to create gate 332. Gate 332 may be planarized or recessed. An implant may then be performed to form the source for the transistor in the upper portion of active area 33 to 4. Alternatively, the source and drain of the vertical transistor may be switched.

The remainder of a DRAM cell, including connections to word and bit lines, may be completed using conventional DRAM processing techniques. The resulting DRAM may then be employed in a variety of commercial and consumer electronics devices, including computers.

There are many alternative materials and processes which could be substituted for those disclosed in the above embodiments by one of ordinary skill in the art, and all such alternatives are considered to be within the scope of the present invention. For example, various other types of etches, such as a dry etch, may be used in accordance with the present invention to selectively etch specific crystal planes in the trench sidewalls. As another example, p-type materials or doping may be substituted for n-type materials and doping, and vice versa. In addition, the order of process steps may be rearranged by one of ordinary skill in the art, yet still be within the scope of the present invention. As used herein, devices, layers, materials, etc. may be described, for example, as being "in" a trench, or formed "on" a trench sidewall surface, and all such descriptions are generally intended to include such devices, layers, and materials extending into regions proximate the trench or sidewall surface where appropriate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a vertically oriented device in a deep trench on a semiconductor substrate, said trench comprising a rounded perimeter, said method comprising:

masking a first region of a substrate sidewall in said trench, wherein said masking said first region comprises filling in said trench with a mask layer and removing said mask layer from a second region of said trench, wherein a second region of said substrate sidewall in said trench is exposed, said second region of said substrate sidewall comprising multiple substrate crystal planes;

selectively etching a first crystal plane of said multiple substrate crystal planes in said trench, thereby forming a substantially flat substrate sidewall comprising a second crystal plane in said second region of said trench, wherein said perimeter in said first region of said trench remains rounded; and forming a vertical component of said vertically oriented device on said flat substrate sidewall.

2. The method of claim 1, wherein said removing said mask layer further comprises removing any other material covering said substrate sidewall in said second region of said trench.

3. The method of claim 1, wherein said first crystal plane is a <100> crystal plane.

4. The method of claim 3, wherein multiple <100> crystal plane surfaces in said second region are etched.

5. A method of forming a vertically oriented device in a deep trench on a semiconductor substrate, said trench comprising a rounded perimeter, said method comprising:

masking a first region of a substrate sidewall in said trench, wherein a second region of said substrate sidewall in said trench is exposed, said second region comprising multiple substrate crystal planes;

selectively etching a first crystal plane of said multiple substrate crystal planes in said trench, thereby forming a substantially flat substrate sidewall comprising a second crystal plane in said second region of said trench, wherein said perimeter in said first region of said trench remains rounded, and wherein said perimeter in said first region is oval; and forming a vertical component of said vertically oriented device on said flat substrate sidewall.

6. The method of claim 1, wherein said selective etching is highly selective toward said first substrate crystal plane over said second substrate crystal plane, and wherein said selective etching only minimally etches said sidewall in said second substrate crystal plane direction.

7. The method of claim 1, wherein said vertical device is a transistor, wherein said forming a vertical component comprises forming a transistor gate oxide on said flat substrate sidewall, and wherein said oxide has a substantially uniform thickness over said transistors channel.

8. A method of forming a vertically oriented device in a deep trench on a semiconductor substrate, said trench comprising a rounded perimeter, said method comprising:

masking a first region of a substrate sidewall in said trench, wherein a second region of said substrate sidewall in said trench is exposed, said second region comprising multiple substrate crystal planes;

selectively etching a first crystal plane of said multiple substrate crystal planes in said trench, thereby forming a substantially flat substrate sidewall comprising a second crystal plane in said second region of said trench, wherein said selectively etching comprises a selective wet etch, and wherein said perimeter in said first region of said trench remains rounded; and forming a vertical component of said vertically oriented device on said flat substrate sidewall.

9. The method of claim 1, wherein said substrate is silicon, and wherein said selectively etching comprises using an $NH_4OH$ solution.

10. A method of forming a dynamic random access memory (DRAM) integrated circuit, said method comprising:

at forming an isolation collar on an upper interior surface of a deep trench located in a semiconductor substrate, wherein said trench comprises a rounded perimeter;

filling in said trench with a mask layer;

removing said mask layer from a second region of said trench, thereby exposing said isolation collars sidewall in said second region of said trench, wherein the remaining mask layer in a first region of said trench masks said isolation collar in said first region of said trench;

removing said exposed portion of said isolation collar in said second region, thereby exposing a substrate sidewall in said second region of said trench, wherein said exposed substrate sidewall comprises multiple substrate crystal planes;

selectively etching a first crystal plane of said multiple substrate crystal planes in said trench, thereby forming a substantially flat substrate sidewall comprising a second crystal plane in said second region of said trench, wherein said perimeter in said first region of said trench remains rounded; and forming a vertically oriented device on said flat substrate sidewall.

11. The method of claim 10, wherein said substrate is silicon and said first crystal plane is a <100> crystal plane.

12. The method of claim 11, wherein multiple <100> crystal plane surfaces in said second region are etched.

13. The method of claim 11, wherein said second crystal plane is a <110> crystal plane.

14. The method of claim 10, wherein said perimeter in said first region is oval.

15. The method of claim 10 further comprising forming a trench capacitor in a lower portion of said trench before said filling in said trench with said mask layer.

16. The method of claim 10, wherein said selective etching is highly selective toward said first substrate crystal plane over said second substrate crystal plane, and wherein said selective etching only minimally etches said sidewall in said second substrate crystal plane direction.

17. The method of claim 10, wherein said vertical device is a transistor, wherein said forming said vertical device comprises forming a transistor gate oxide on said flat substrate sidewall, and wherein said oxide has a substantially uniform thickness over said transistor's channel.

18. The method of claim 10, wherein said substrate is silicon, and wherein said selectively etching comprises a selective wet etch using an $NH_4OH$ solution.

19. The method of claim 3, wherein said second crystal plane is a <110> crystal plane.

* * * * *